United States Patent
Suk

(10) Patent No.: US 11,107,700 B2
(45) Date of Patent: Aug. 31, 2021

(54) SEMICONDUCTOR PACKAGE METHOD OF FABRICATING SEMICONDUCTOR PACKAGE AND METHOD OF FABRICATING RE-DISTRIBUTION STRUCTURE

(71) Applicant: Samsung Electronics Co., Ltd., Suwon-si (KR)

(72) Inventor: Kyoung Lim Suk, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/415,272

(22) Filed: May 17, 2019

(65) Prior Publication Data

US 2020/0111681 A1  Apr. 9, 2020

(30) Foreign Application Priority Data

Oct. 5, 2018  (KR) .................. 10-2018-0119094

(51) Int. Cl.
| | |
|---|---|
| H01L 21/768 | (2006.01) |
| H01L 21/48 | (2006.01) |
| H01L 23/00 | (2006.01) |
| H01L 25/10 | (2006.01) |
| H01L 25/00 | (2006.01) |
| H01L 23/31 | (2006.01) |
| H01L 23/498 | (2006.01) |
| H01L 23/538 | (2006.01) |

(52) U.S. Cl.
CPC ...... *H01L 21/4853* (2013.01); *H01L 23/3128* (2013.01); *H01L 23/49816* (2013.01); *H01L 23/5389* (2013.01); *H01L 24/16* (2013.01); *H01L 25/105* (2013.01); *H01L 25/50* (2013.01); *H01L 2224/16225* (2013.01); *H01L 2225/1035* (2013.01); *H01L 2225/1058* (2013.01)

(58) Field of Classification Search
CPC ... H01L 21/4853; H01L 21/56; H01L 21/768; H01L 21/76802; H01L 21/7687; H01L 21/76895
See application file for complete search history.

(56) References Cited

U.S. PATENT DOCUMENTS

| | | |
|---|---|---|
| 7,727,862 B2 | 6/2010 | Jobetto |
| 8,531,012 B2 | 9/2013 | Lee et al. |
| 8,922,005 B2 | 12/2014 | Hu et al. |
| 9,385,056 B2 | 7/2016 | Hu et al. |
| 9,417,285 B2 | 8/2016 | Wang et al. |
| 9,576,917 B1 | 2/2017 | Huemoeller et al. |
| 9,601,463 B2 | 3/2017 | Yu et al. |

(Continued)

FOREIGN PATENT DOCUMENTS

| | | |
|---|---|---|
| KR | 10-1190920 B1 | 10/2012 |
| KR | 10-1550496 B1 | 9/2015 |

(Continued)

*Primary Examiner* — Cuong Q Nguyen
(74) *Attorney, Agent, or Firm* — Muir Patent Law, PLLC

(57) ABSTRACT

A method of fabricating a semiconductor package may include forming a lower re-distribution layer, forming a stack, bonding the stack to a portion of the lower re-distribution layer, stacking a semiconductor chip on a top surface of the lower re-distribution layer, and forming an upper re-distribution layer on the semiconductor chip and the stack.

19 Claims, 16 Drawing Sheets

(56) References Cited

U.S. PATENT DOCUMENTS

| | | |
|---|---|---|
| 9,865,525 B2 | 1/2018 | Lin et al. |
| 9,953,959 B1 | 4/2018 | Darmawikarta et al. |
| 9,991,206 B1 | 6/2018 | Chang et al. |
| 9,991,219 B2 | 6/2018 | Seol et al. |
| 9,991,239 B2 | 6/2018 | Nair et al. |
| 10,720,392 B2 | 7/2020 | Aoki |
| 2010/0327419 A1 | 12/2010 | Muthukumar et al. |
| 2016/0218093 A1 | 7/2016 | Mortensen et al. |
| 2017/0194300 A1 | 7/2017 | Lin et al. |
| 2017/0287839 A1* | 10/2017 | Lee .................. H01L 21/76877 |
| 2018/0130782 A1* | 5/2018 | Lee .................. H01L 21/561 |
| 2019/0164912 A1* | 5/2019 | Lee .................. H01L 21/4853 |
| 2020/0105663 A1* | 4/2020 | Tsai .................. H01L 21/76871 |

FOREIGN PATENT DOCUMENTS

| | | |
|---|---|---|
| KR | 10-2015-0121490 A | 10/2015 |
| KR | 10-2015-0121759 A | 10/2015 |

* cited by examiner

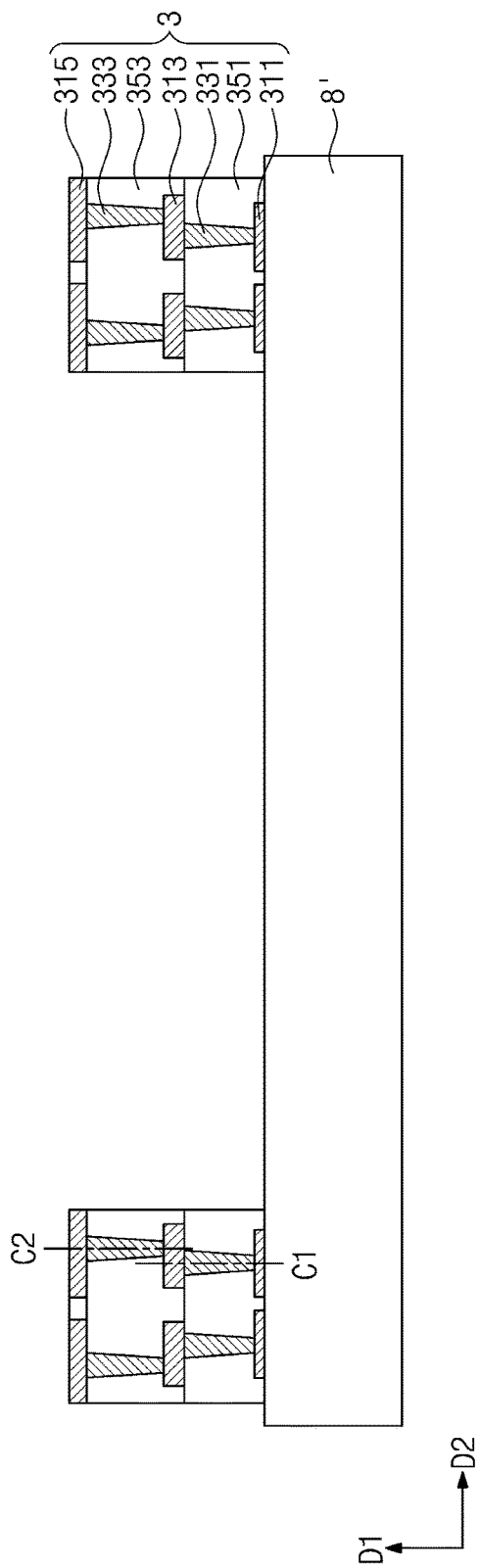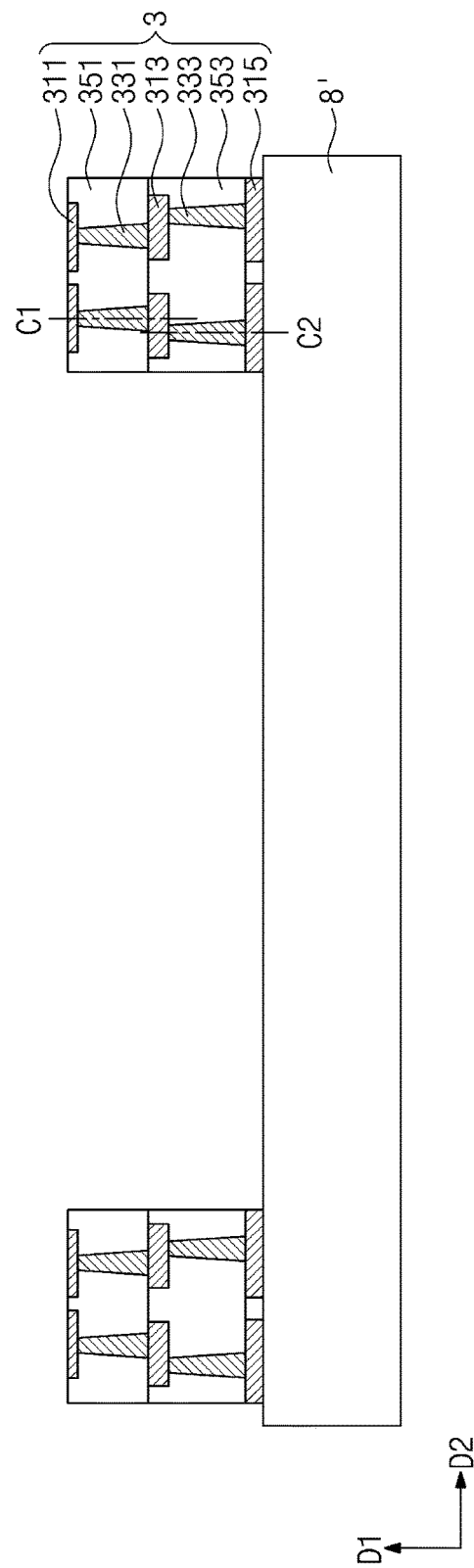

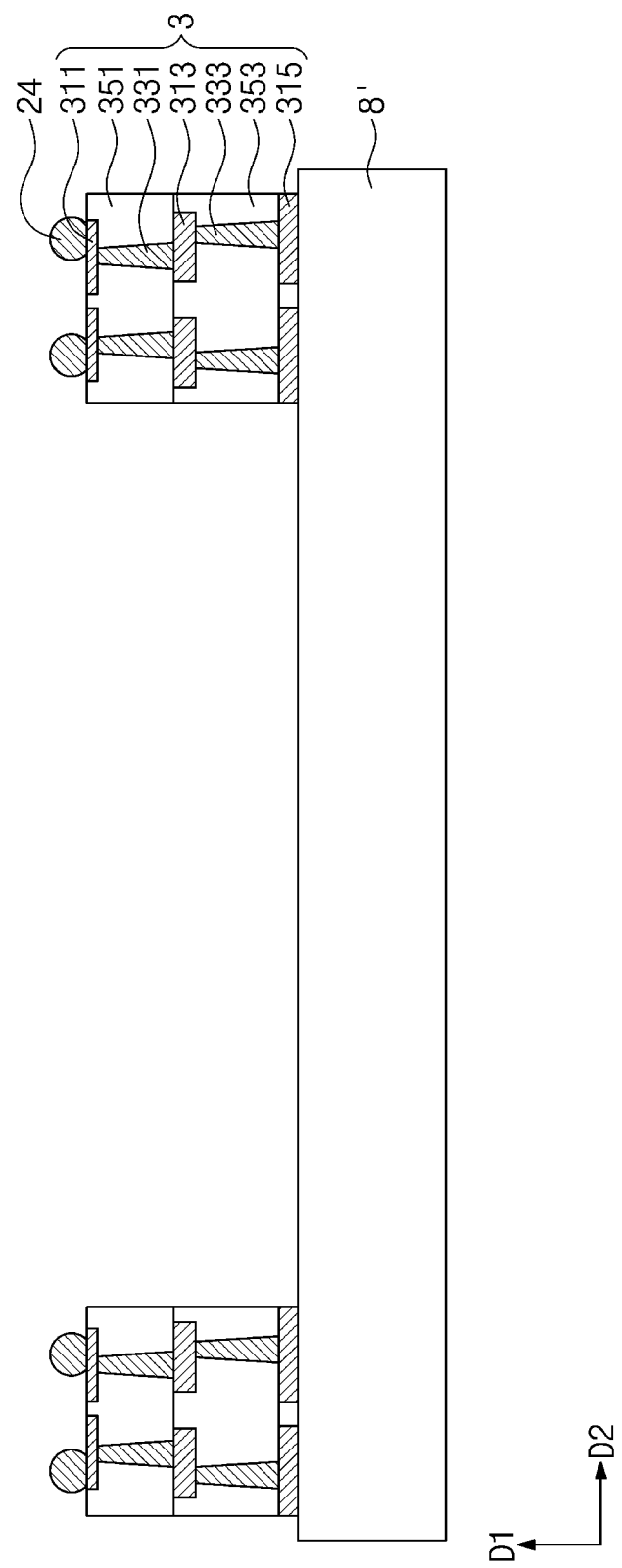

SEMICONDUCTOR PACKAGE METHOD OF FABRICATING SEMICONDUCTOR PACKAGE AND METHOD OF FABRICATING RE-DISTRIBUTION STRUCTURE

CROSS-REFERENCE TO RELATED APPLICATIONS

This U.S. non-provisional patent application claims priority under 35 U.S.C. § 119 to Korean Patent Application No. 10-2018-0119094, filed on Oct. 5, 2018, in the Korean Intellectual Property Office, the entire contents of which are hereby incorporated by reference.

BACKGROUND OF THE INVENTION

The present disclosure relates to a semiconductor package, and in particular, to a semiconductor package including a re-distribution layer.

In the case where an integrated circuit (IC) chip is provided in the form of a semiconductor package, it can be easily used as a part of an electronic product. In general, the semiconductor package includes a printed circuit board (PCB) and a semiconductor chip, which is mounted on the PCB and is electrically connected to the PCB by bonding wires or bumps.

With the recent advance in electronic industry, there is an increasing demand for high-performance, high-speed and compact electronic systems. Various semiconductor package techniques are being used to meet such a demand. For example, a semiconductor package device may include a plurality of semiconductor chips mounted on a package substrate or a semiconductor device package may be stacked on another package to meet such a demand.

SUMMARY

Some embodiments of the inventive concept provide a method of fabricating a semiconductor package with a re-distribution layer, using a chip-last process.

Some embodiments of the inventive concept provide a method capable of reducing a size of vias in a semiconductor package.

According to some embodiments of the inventive concept, a semiconductor package may include a lower re-distribution layer, a stack provided on a first region of a top surface of the lower re-distribution layer, a semiconductor chip provided on a second region of the top surface of the lower re-distribution layer, and an upper re-distribution layer on the semiconductor chip and the stack. The upper re-distribution layer may be electrically connected to the lower re-distribution layer via the stack.

According to some embodiments of the inventive concept, a method of fabricating a semiconductor package may include forming a lower re-distribution layer, forming a stack, bonding the stack to a portion of the lower re-distribution layer, stacking a semiconductor chip on a top surface of the lower re-distribution layer after bonding the stack, and forming an upper re-distribution layer on the semiconductor chip and the stack.

According to some embodiments of the inventive concept, a method of fabricating a re-distribution structure may include forming a lower re-distribution layer, forming a stack, and bonding the stack to a top surface of the lower re-distribution layer. The stack may include a first insulating layer disposed on the top surface of the lower re-distribution layer, a second insulating layer disposed on a top surface of the first insulating layer, a first via penetrating the first insulating layer, and a second via penetrating the second insulating layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 4A to 4C are sectional views illustrating steps of forming stack structures, according to the flow chart of FIG. 1.

Figure 1:
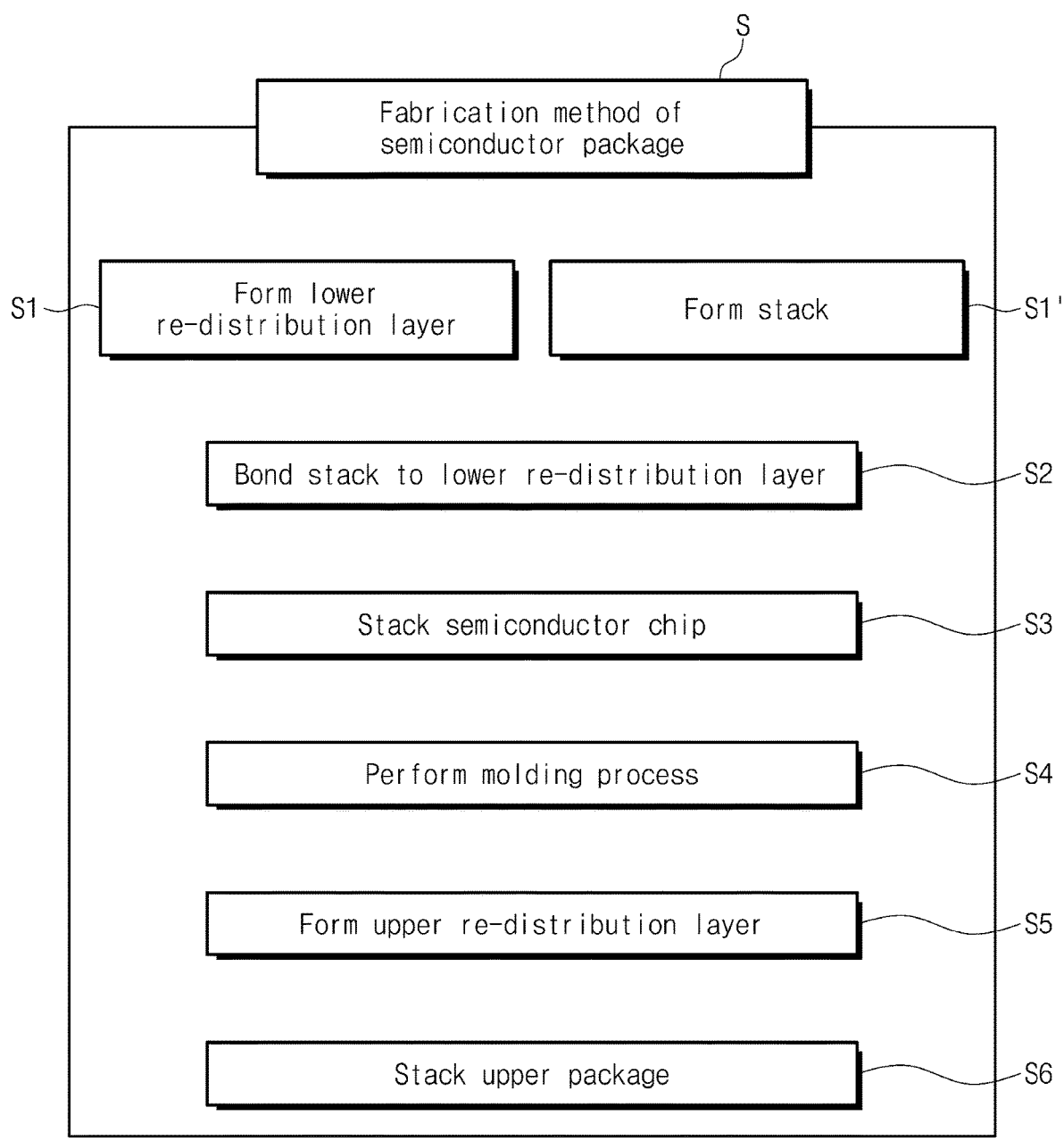
FIG. 1 is a flow chart illustrating a method of fabricating a semiconductor device, according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Like reference numerals in the drawings denote like elements, and thus their description will be omitted.

FIG. 1 is a flow chart illustrating a method of fabricating a semiconductor package, and FIGS. 2 to 9 are sectional views illustrating a process of fabricating a semiconductor package, according to the flow chart of FIG. 1.

Hereinafter, a direction D1 of FIG. 2 will be referred to as a first or upward direction and a direction D2 will be referred to as a second or rightward direction.

Referring to FIG. 1, a method S of fabricating a semiconductor package may include forming a lower re-distribution layer (in S1), forming a stack (in S1'), bonding the stack to the lower re-distribution layer (in S2), stacking a semiconductor chip (in S3), performing a molding process (in S4), forming an upper re-distribution layer (in S5), and stacking an upper package (in S6).

Figure 2:
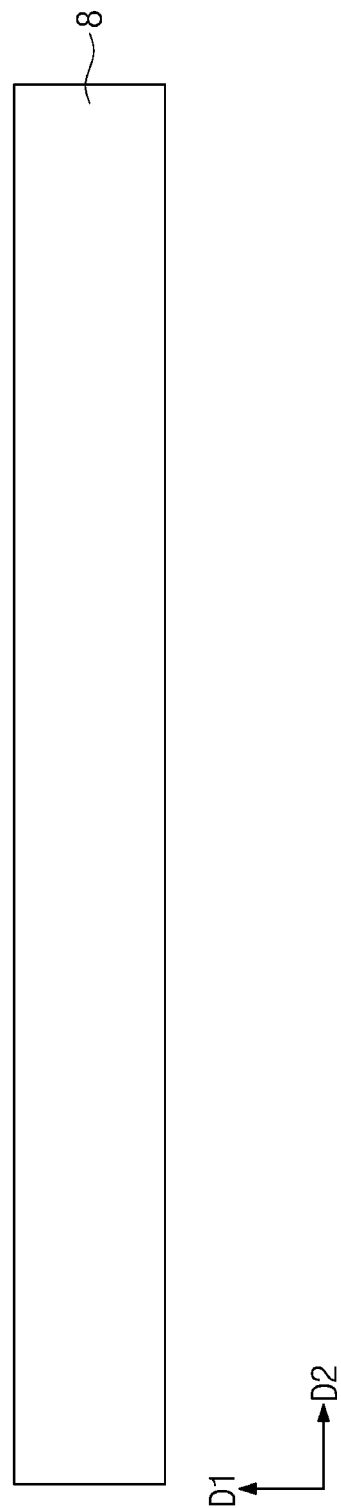
FIG. 2 is a sectional view illustrating a first carrier substrate according to an embodiment of the inventive concept.
Figure 3:
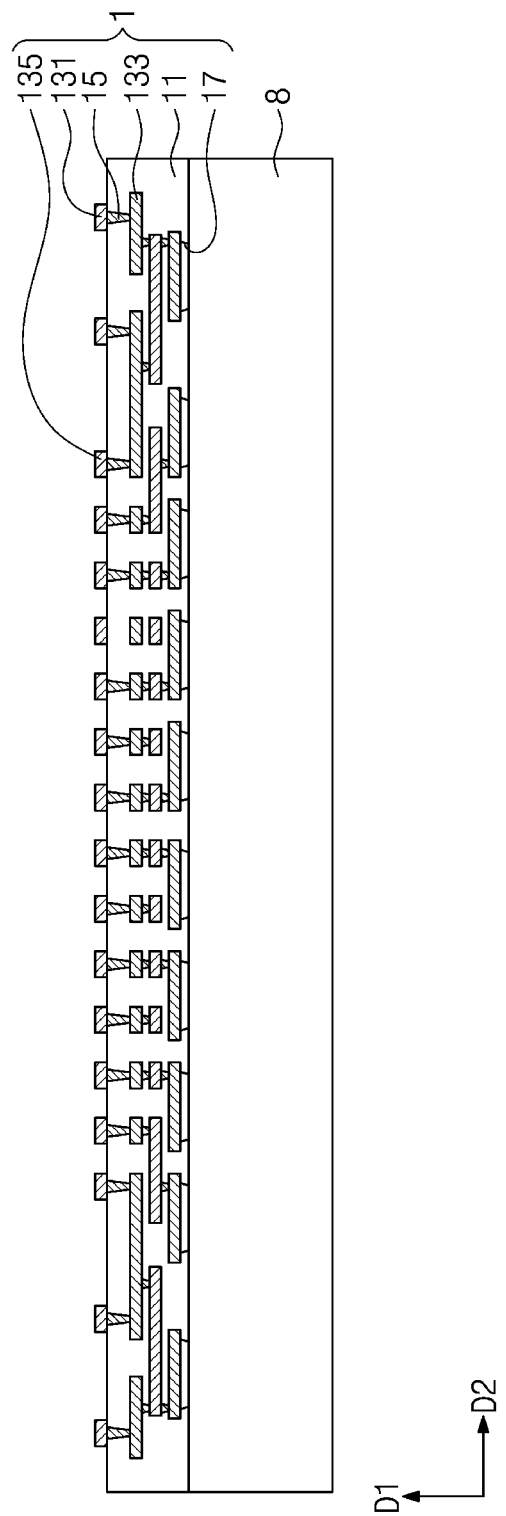
FIG. 3 is a sectional view illustrating a step of forming a lower re-distribution layer, according to the flow chart of FIG. 1.

Referring to FIGS. 1 and 2, a first carrier substrate 8 may be provided for the forming of the lower re-distribution layer (in S1). Referring to FIG. 3, a lower re-distribution layer 1 may be formed on a top surface of the first carrier substrate 8. In an embodiment, the lower re-distribution layer 1 may be formed by depositing or coating a photosensitive material on the first carrier substrate 8, forming holes in the photosensitive material by an exposure and develop process, and filling the holes with a conductive material.

The lower re-distribution layer 1 may include a lower redistribution insulator 11, a lower redistribution outer terminal 131, a lower redistribution pattern 133, a lower redistribution connection terminal 135, and a lower redistribution via 15. A lower redistribution hole 17 may be provided in a bottom surface of the lower redistribution insulator 11. For example, the lower redistribution layer 1 may be a layer configured to redistribute in/out pads of a semiconductor chip into different spatial positions and/or shapes, e.g., into a wider distribution than the original one on the semiconductor chip and/or into bigger pads than the original ones formed on the semiconductor chip. In certain embodiments, the lower redistribution layer 1 may electrically connect two or more pads formed on the semiconductor chip.

The lower redistribution insulator 11 may include a photosensitive material. In an embodiment, the photosensitive material may include a photosensitive polymer. The photosensitive polymer may include at least one of photosensitive polyimide (PSPI), polybenzoxazole (PBO), phenolic polymer, benzocyclobutene (BCB) polymer, or a photo imageable dielectric (PID) material. However, the inventive concept is not limited to the example materials for the lower redistribution insulator 11. The lower redistribution insulator 11 may be used as a main body of the lower re-distribution layer 1. The lower redistribution insulator 11 may protect the lower redistribution pattern 133. The lower redistribution insulator 11 may have a multi-layered structure.

In an embodiment, a plurality of the lower redistribution patterns 133 may be provided in the first and second directions D1 and D2. The lower redistribution patterns 133, which are spaced apart from each other in the first direction D1, may be provided to form a plurality of layers, e.g., a plurality of layers of lower redistribution patterns 133. For example, the lower redistribution patterns 133 may be spaced apart from each other in the second direction D2 as shown in FIG. 3.

The lower redistribution via 15 may be used to electrically connect the lower redistribution patterns 133, which are spaced apart from each other in the first direction D1, to each other. In the present specification, the expression "electrically connect elements" may mean a direct connection between the elements or an indirect connection between the elements through another conductive element. The lower redistribution via 15 may have an increasing width in a direction along the first direction D1, e.g., in a cross-sectional view. However, the inventive concept is not limited to this example, and in an embodiment, the width of the lower redistribution via 15 may be constant in the first direction D1 or may vary in various other manners.

The lower redistribution outer terminal 131 may be placed on a first region of a top surface of the lower redistribution insulator 11. The first region may be an edge region of the top surface of the lower redistribution insulator 11. In an embodiment, the lower redistribution outer terminal 131 may be a pad. For example, the lower redistribution outer terminal 131 may be a contact pad configured to be electrically connected to (e.g., contact) a solder ball. In an embodiment, a plurality of the lower redistribution outer terminals 131 may be provided. The lower redistribution outer terminal 131 may be used to electrically connect at least one of the lower redistribution patterns 133 to integrated circuits (not shown) of a semiconductor chip 5 (e.g., see FIG. 9).

The lower redistribution connection terminal 135 may be placed on a second region of the top surface of the lower redistribution insulator 11. The second region may be a center region of the top surface of the lower redistribution insulator 11. For example, the second region may be positioned within a region enclosed by the first region, e.g., in a plan view. For example, the first region may be closer to the side surface of the lower redistribution insulator 11 than the second region. In an embodiment, the lower redistribution connection terminal 135 may be a pad. For example, the lower redistribution connection terminal 135 may be a contact pad configured to be electrically connected to (e.g., contact) a solder ball. In an embodiment, a plurality of the lower redistribution connection terminals 135 may be provided. The lower redistribution connection terminal 135 may be used to electrically connect at least one of the lower redistribution patterns 133 to a stack 3 (e.g., see FIG. 9).

Each of the lower redistribution outer terminal 131, the lower redistribution pattern 133, the lower redistribution connection terminal 135, and the lower redistribution via 15 may be formed of or include a conductive material. In an embodiment, the conductive material may include metallic materials such as copper or aluminum. The lower redistribution hole 17 may be formed in a bottom surface of the lower re-distribution layer 1 to have a specific depth in the first direction D1, thereby exposing at least one of the lower redistribution patterns 133.

Referring to FIGS. 1 and 4A, a stack 3 may be formed on a top surface of a second carrier substrate 8' during the forming of the stack (in S1'). The stack 3 may include a first via 331, a second via 333, a first terminal 311, a first interconnection line 313, a second terminal 315, a first insulator 351, and a second insulator 353. The first insulator 351 may be placed on the second insulator 353. The first via 331 may be provided to penetrate the first insulator 351. The second via 333 may be provided to penetrate the second insulator 353. The first via 331 and the second via 333 may be electrically connected to each other through the first interconnection line 313. The first terminal 311 may be connected to the first via 331. For example, the stack 3 may be a stack of insulators and conductor patterns (e.g., conductor lines and/or contact vias).

In an embodiment, the first via 331 and the second via 333 may be off-centered from each other, when viewed in a plan view. For example, a vertically extending central axis C1 extending along a geometric center of the first via 331 may be spaced apart from a vertically extending central axis C2 extending along a geometric center of the second via 333. The first and second vias 331 and 333, which are off-centered from each other, may be connected to each other by the first interconnection line 313. This off-centered structure of the first and second vias 331 and 333 may be beneficial to electrically connect offset contact pads respectively formed on the first redistribution layer 1 and a second redistribution layer 7 which will be described below.

The stack 3 may be formed by depositing or coating a photosensitive material, forming holes in the photosensitive material by an exposure and develop process, and filling the holes with a conductive material. However, the inventive concept is not limited to this example, and the stack 3 may be formed by other methods.

At least one of the first insulator 351 and the second insulator 353 may include a photosensitive material. In an embodiment, the photosensitive material may include a photosensitive polymer. The photosensitive polymer may include at least one of photosensitive polyimide (PSPI), polybenzoxazole (PBO), phenolic polymer, benzocyclobutene (BCB) polymer, or a photo imageable dielectric (PID) material. However, the inventive concept is not limited to the example materials for the photosensitive material.

The first via 331, the second via 333, the first interconnection line 313, the second terminal 315, and the first terminal 311 may be formed of or include at least one conductive material. In an embodiment, the conductive material may include aluminum or copper, but the inventive concept is not limited thereto.

Referring to FIG. 4B, the stack 3 may be vertically inverted on the second carrier substrate 8'. As a result of the vertical inversion of the stack 3, the first terminal 311 may be exposed upwardly.

Referring to FIG. 4C, a connection ball 24 may be formed on the first terminal 311. In an embodiment, the connection ball 24 may be a solder ball, but the inventive concept is not limited thereto.

The order of forming the lower re-distribution layer (in S1) and the stack (in S1') in FIG. 1 may be changed. For example, the forming of the lower re-distribution layer (in S1) may be performed before the forming of the stack (in S1'), or the forming of the stack (in S1') may be performed before the forming of the lower re-distribution layer (in S1). Alternatively, the forming of the lower re-distribution layer (in S1) and the forming of the stack (in S1') may be performed at the same time. For example, the lower redistribution layer 1 and the stack 3 may be formed at the same time from different manufacturing apparatuses, and then may be combined as shown in FIG. 5.

Figure 5:
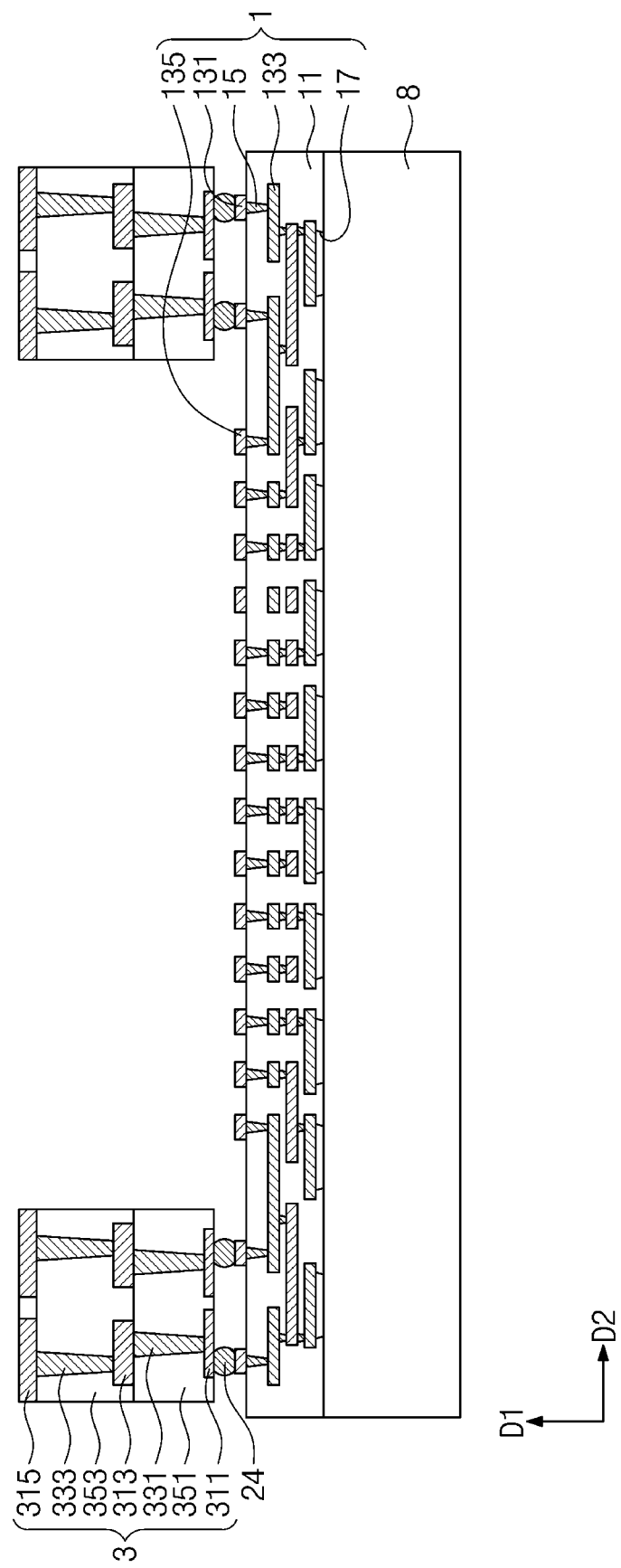
FIG. 5 is a sectional view illustrating a step of bonding a stack to a lower re-distribution layer, according to the flow chart of FIG. 1.

Referring to FIGS. 1 and 5, the bonding of the stack 3 to the lower re-distribution layer (in S2) may include boding the stack 3 on the lower re-distribution layer 1. For example, the stack 3 of FIG. 3B may be inverted in such a way that the connection ball 24 is in contact with the lower redistribution outer terminal 131 of the lower re-distribution layer 1. When the connection ball 24 is disposed on a top surface of the lower redistribution outer terminal 131, a bonding process may be performed. The bonding process may be a reflow process or a thermo-compression process, but the inventive concept is not limited thereto. The connection ball 24 and the lower redistribution outer terminal 131 may be bonded to each other by the bonding process. The second terminal 315, the second via 333, the first interconnection line 313, the first via 331, the first terminal 311, and the connection ball 24 may be electrically connected to the lower redistribution pattern 133 through the lower redistribution outer terminal 131. The stack 3 and the lower re-distribution layer 1 bonded to each other may be referred to as a re-distribution structure. In an embodiment, in the case where the lower redistribution insulator 11 is a multi-layered structure, the first insulator 351 may be thicker than one of the layers constituting the lower redistribution insulator 11. In an embodiment, the first via 331 may have a decreasing or constant width in a direction from the top surface of the first insulator 351 toward the lower re-distribution layer 1, e.g., in a cross-sectional view. The second via 333 may have a decreasing or constant width in a direction from a top surface of the second insulating layer 353 toward the first insulator 351, e.g., in a cross-sectional view.

Figure 6:
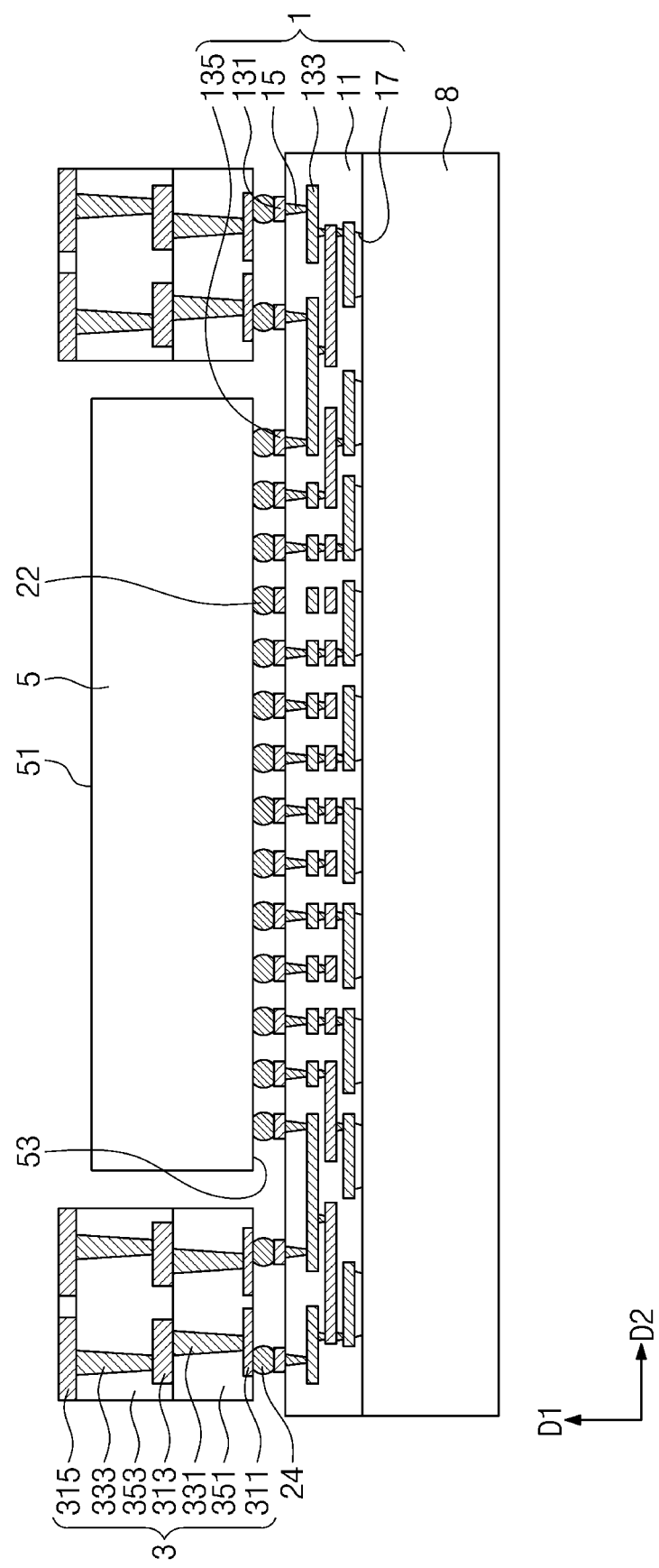
FIG. 6 is a sectional view illustrating a step of stacking a semiconductor chip, according to the flow chart of FIG. 1.

Referring to FIGS. 1 and 6, the stacking of the semiconductor chip (in S3) may include stacking a semiconductor chip 5 on a top surface of the lower re-distribution layer 1. The semiconductor chip 5 may include at least one of a memory chip, a logic chip, or a combination thereof. The semiconductor chip 5 may be electrically connected to the lower redistribution connection terminal 135 of the lower re-distribution layer 1 via an intermediate ball 22. Thus, the semiconductor chip 5 may be electrically connected to the lower redistribution pattern 133. The semiconductor chip 5 may be provided in such a way that a bottom surface 53 thereof faces the top surface of the lower re-distribution layer 1. The intermediate ball 22 may be a solder ball, but the inventive concept is not limited thereto.

When the semiconductor chip 5 is stacked on the top surface of the lower re-distribution layer 1 with the intermediate ball 22 interposed therebetween, the bonding process may be performed. During the bonding process, the intermediate ball 22 may reflow to bond the lower redistribution pad 135 to the semiconductor chip 5. During the bonding process, heat and pressure may be applied to the intermediate ball 22 so that the intermediate ball 22 may be bonded to the semiconductor chip 5. For example, the bonding process may be a reflow process or a thermo-compression process, but the inventive concept is not limited thereto. The intermediate ball 22 and the lower redistribution connection terminal 135 may be bonded to each other by the bonding process.

Figure 7:
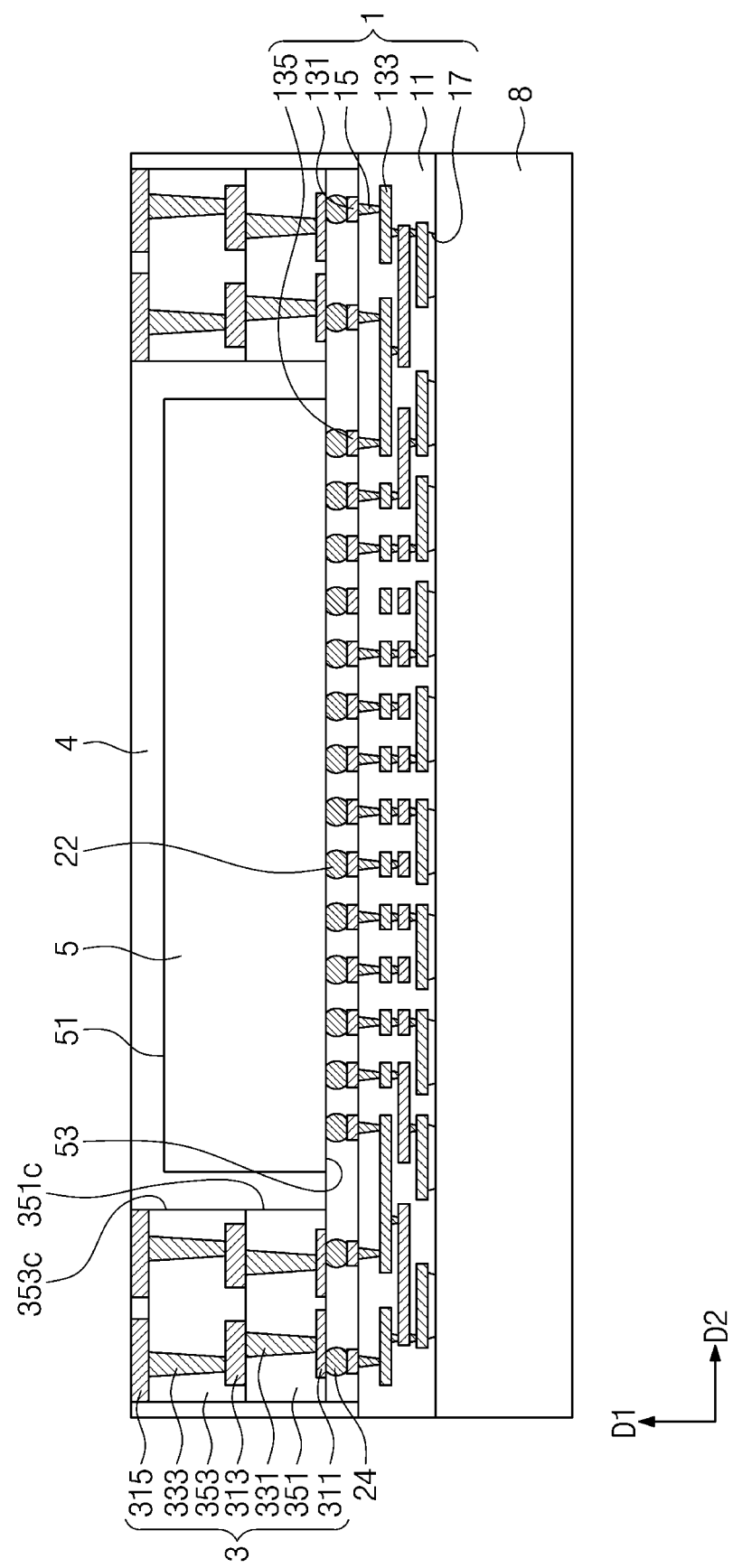
FIG. 7 is a sectional view illustrating a molding step, according to the flow chart of FIG. 1.

Referring to FIGS. 1 and 7, the molding process (in S4) may include forming a mold layer 4 to cover at least one of surfaces of the semiconductor chip 5. The mold layer 4 may protect the semiconductor chip 5 from external attack. For example, owing to the mold layer 4, the semiconductor chip 5 may be protected from external heat, moisture, and/or impact. The mold layer 4 may be configured to exhaust (e.g., release) heat, which is generated from the semiconductor chip 5, the lower re-distribution layer 1, and/or the stack 3, to the outside. In an embodiment, the mold layer 4 may cover a top surface 51 of the semiconductor chip 5. In an embodiment, the mold layer 4 may cover an outer side surface (not shown) of the stack 3. The mold layer 4 may be provided to fill a gap region between a side surface of the semiconductor chip 5 and a first inner side surface 351c and/or a second inner side surface 353c of the stack 3. For example, the side surface of the semiconductor chip 5 is parallel to the first and second inner side surfaces 351c and 353c of respective first and second insulators of the stack 3. An under fill layer may be further provided around the lower redistribution connection terminal 135. In an embodiment, the mold layer 4 may be formed of or include an epoxy molding compound (EMC) material. For example, the mold layer may be formed of a different material from the first and second insulators 351 and 353 of the stack 3. The molding process may include placing the lower re-distribution layer 1, on which the semiconductor chip 5 and the stack 3 are stacked, in a mold and then injecting a material for the mold layer 4 into the mold. In an embodiment, the mold layer 4 may include an Ajinomoto build-up film (ABF). However, the inventive concept is not limited thereto, and other insulator may be used for the mold layer 4.

Figure 8:
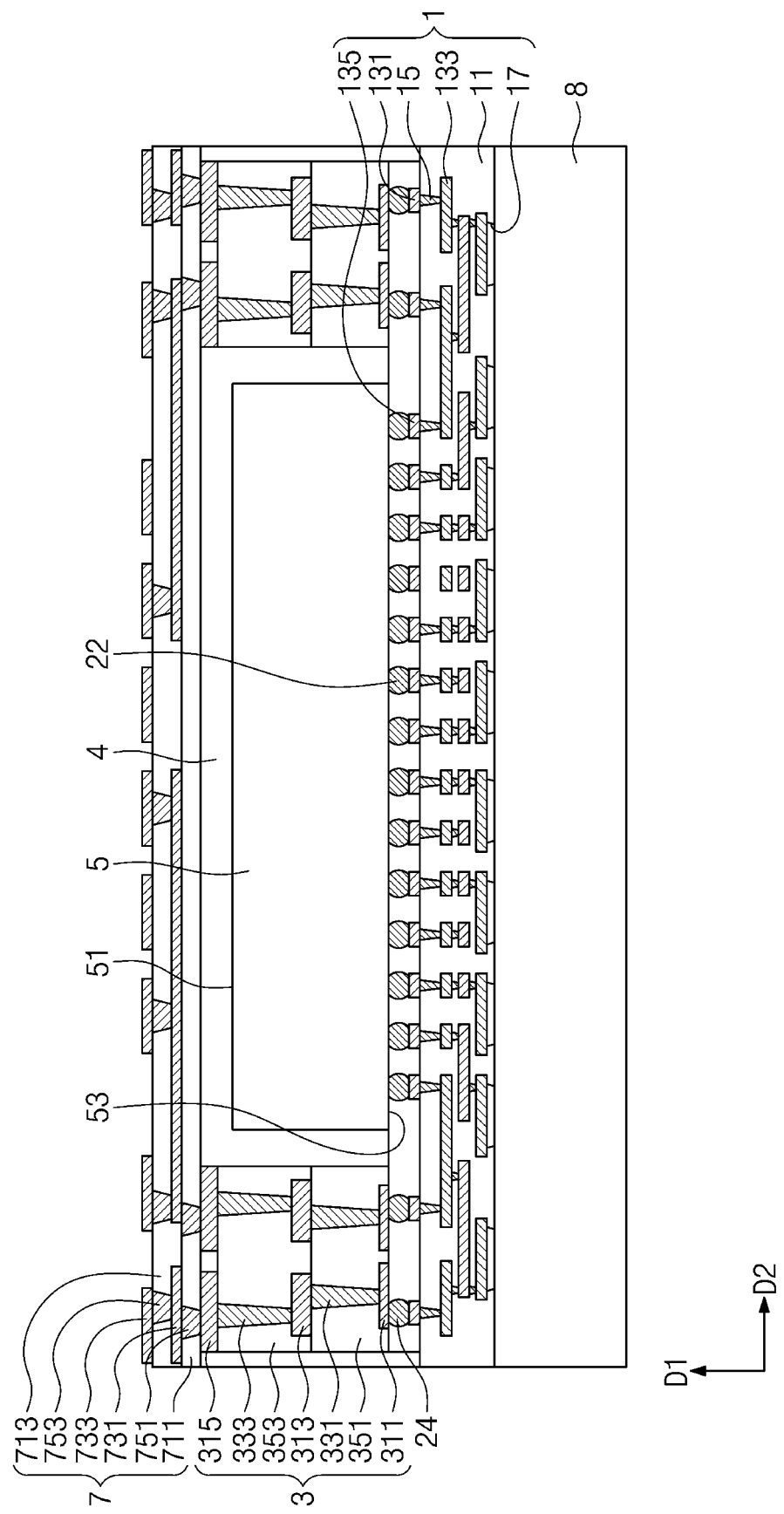
FIG. 8 is a sectional view illustrating a step of forming an upper re-distribution layer, according to the flow chart of FIG. 1.

Referring to FIGS. 1 and 8, the forming of the upper re-distribution layer (in S5) may include forming an upper re-distribution layer 7 on the top surface of the mold layer 4 and/or on a top portion of the stack 3, after the molding process. In an embodiment, the upper re-distribution layer 7 may be formed by depositing or coating a photosensitive material on the top surface of the mold layer 4 and/or the top portion of the stack 3, forming holes in the photosensitive material by an exposure and develop process, and filling the holes with a conductive material. The upper re-distribution layer 7 may include a first upper redistribution insulating layer 711, a second upper redistribution insulating layer 713, an upper redistribution pattern 731, a first upper redistribution via 751, a second upper redistribution via 753, and an upper redistribution terminal 733. For example, the upper redistribution layer 7 may be a layer configured to redistribute in/out pads of a semiconductor chip into different spatial positions and/or shapes, e.g., into a wider distribution than the original one formed on the semiconductor chip and/or into bigger pads than the original ones formed on the semiconductor chip. In certain embodiments, the upper redistribution layer 7 may electrically connect two or more pads formed on the semiconductor chip.

The first upper redistribution insulating layer 711 may be provided on the mold layer 4 and the stack 3. For example, the first upper redistribution insulating layer 711 may contact the mold layer 4 and the stack 3, e.g., the second terminal 315 and/or an insulating layer of the stack 3. The second upper redistribution insulating layer 713 may be provided on the first upper redistribution insulating layer 711. The first upper redistribution insulating layer 711 and the second upper redistribution insulating layer 713 may include a photosensitive material. In an embodiment, the photosensitive material may include a photo imageable dielectric (PID) material. However, the inventive concept is not limited to this photosensitive material. The first upper redistribution insulating layer 711 and the second upper redistribution insulating layer 713 may protect the upper redistribution pattern 731, the first upper redistribution via 751, and the second upper redistribution via 753.

The first upper redistribution via 751 may be provided to penetrate the first upper redistribution insulating layer 711. In an embodiment, a plurality of the first upper redistribution vias 751 may be arranged in the second direction D2. At least one of the first upper redistribution vias 751 may be electrically connected to the upper redistribution terminal 733.

The upper redistribution pattern 731 may be provided on the first upper redistribution via 751. In an embodiment, a plurality of the upper redistribution patterns 731 may be provided. At least one of the upper redistribution patterns 731 may extend in the second direction D2. The upper redistribution pattern 731 may be electrically connected to the first upper redistribution via 751.

The second upper redistribution via 753 may be provided to penetrate the second upper redistribution insulating layer 713. In an embodiment, a plurality of the second upper redistribution vias 753 may be arranged in the second direction D2. The second upper redistribution vias 753 may be electrically connected to the upper redistribution pattern 731.

The upper redistribution terminal 733 may be provided on the second upper redistribution via 753. In an embodiment, a plurality of the upper redistribution terminals 733 may be provided. The upper redistribution terminal 733 may be electrically connected to the second upper redistribution via 753. In an embodiment, the upper redistribution terminal 733 may be a pad. For example, the upper redistribution terminal 733 may be a contact pad configured to be electrically connected to (e.g., contact) a solder ball.

Each of the upper redistribution pattern 731, the first upper redistribution via 751, the second upper redistribution via 753, and the upper redistribution terminal 733 may be formed of or include a conductive material. In an embodiment, the conductive material may include metallic materials such as copper or aluminum.

Since the upper re-distribution layer 7 is provided on the semiconductor chip 5, terminals of an upper package 9 (e.g., see FIG. 10A) may be freely disposed. For example, the upper re-distribution layer 7 may reduce difficulty/restriction in designing the upper package 9.

Figure 9:
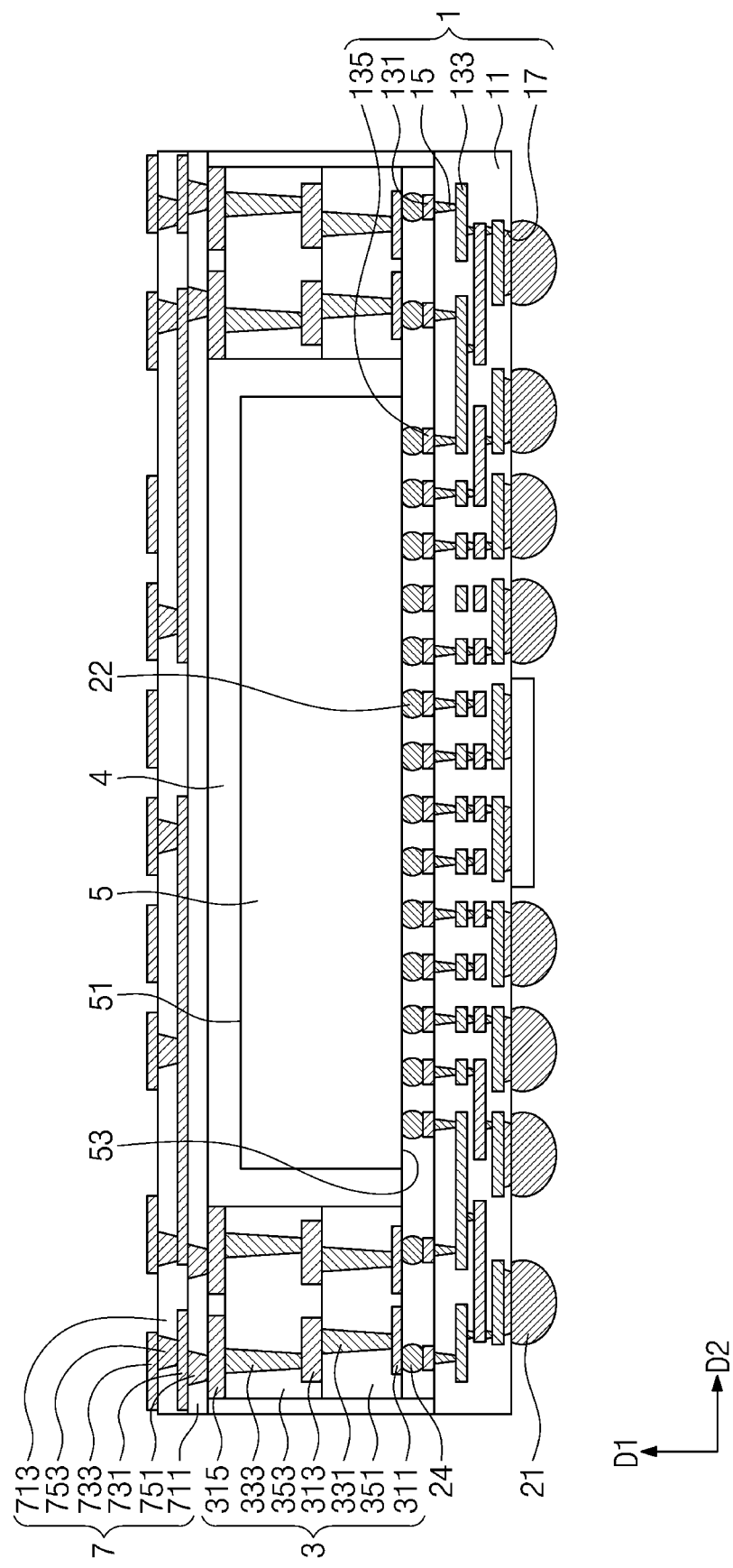
FIG. 9 is a sectional view illustrating a step of removing the first carrier substrate, according to an embodiment of the inventive concept.

Referring to FIG. 9, the first carrier substrate 8 may be removed from the bottom surface of the lower re-distribution layer 1. After the removal of the first carrier substrate 8, lower balls 21 may be formed on the lower redistribution patterns 133 exposed by the lower redistribution hole 17. The lower redistribution patterns 133 may be electrically connected to another package or board through the lower balls 21.

Figure 10A:
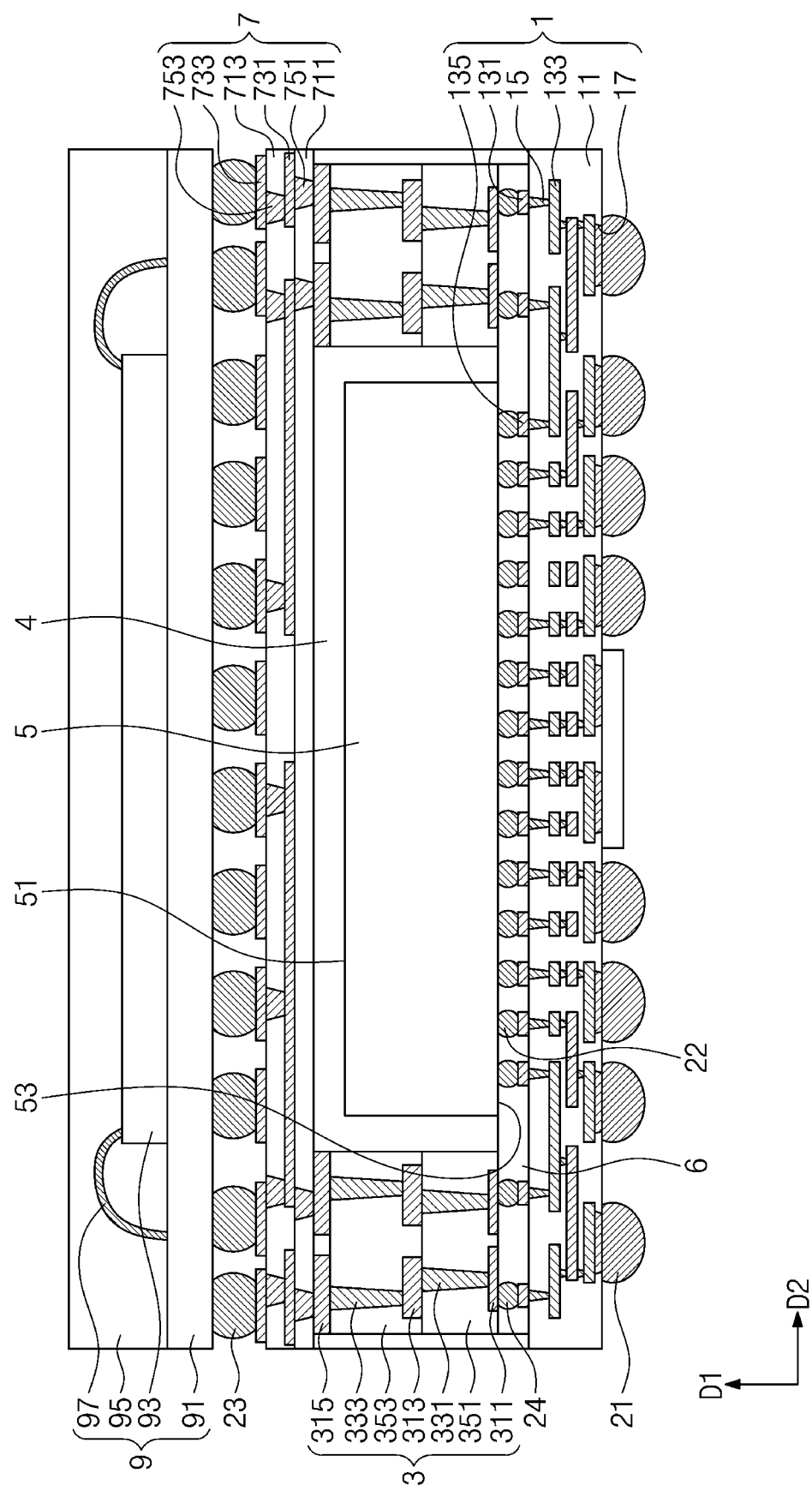
FIG. 10A is a sectional view illustrating a step of stacking an upper package, according to the flow chart of FIG. 1.

Referring to FIGS. 1 and 10A, the stacking of the upper package (in S6) may include stacking the upper package 9 on the upper re-distribution layer 7. The upper package 9 may include an upper substrate 91, an upper semiconductor chip 93, an upper mold layer 95, an upper wire 97, and so forth. The upper package 9 and the upper redistribution terminal 733 may be electrically connected to each other through upper balls 23. The upper balls 23 may be solder balls, but the inventive concept is not limited thereto. The upper ball 23 and the upper redistribution terminal 733 may be bonded to each other, e.g., by a bonding process. The bonding process may be a reflow process or a thermo-compression process. However, the bonding process according to the inventive concept is not limited to the reflow process or a thermo-compression process. The upper semiconductor chip 93 may be electrically connected to the upper wire 97, the upper substrate 91, and the upper ball 23. Thus, the upper package 9 may be electrically connected to the lower re-distribution layer 1 through the upper re-distribution layer 7 and the stack 3.

Figure 10B:
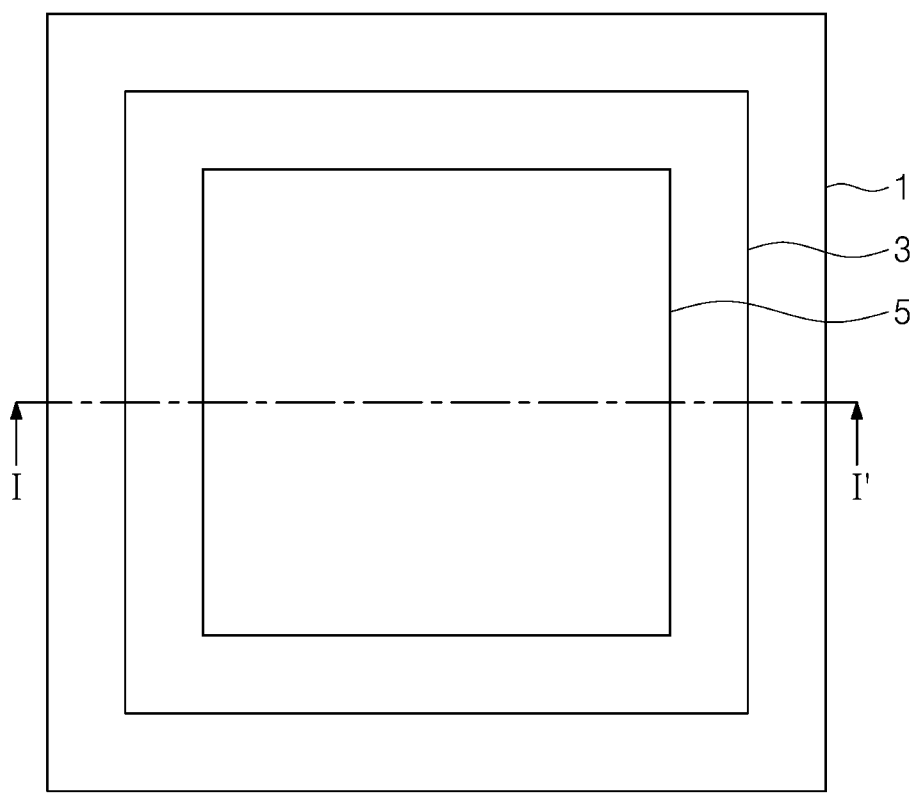
FIG. 10B is a plan view illustrating a semiconductor package according to an embodiment of the inventive concept.

FIG. 10B is a plan view of a semiconductor package according to an embodiment illustrated in FIG. 10A. FIG. 10A is a sectional view taken along a line I-I' of FIG. 10B.

Referring to FIG. 10B, the semiconductor package may be configured in such a way that an area of the semiconductor chip 5 is smaller than an area enclosed by an outer line of the stack 3, when viewed in a plan view. The semiconductor chip 5 may be located inside the stack 3, when viewed in a plan view. FIG. 10B illustrates an example, in which a boundary of the stack 3 is located outside a boundary of the semiconductor chip 5 in all directions, but the inventive concept is not limited thereto. For example, the boundary of the stack 3 may be located outside the boundary of the semiconductor chip 5 in the second direction D2, but the boundary of the semiconductor chip 5 may coincide with the boundary of the stack 3 in a third direction, which is perpendicular to the first and second directions D1 and D2.

In an embodiment, an area of the lower re-distribution layer 1 may be larger than an area of the stack 3, e.g., an area enclosed by an outer line of the stack 3 when viewed in a plan view. However, the inventive concept is not limited thereto, and the area enclosed by an outer line of the stack 3 may be substantially equal to the area of the lower re-distribution layer 1.

In a method of fabricating a semiconductor package according to an example embodiment of the inventive concept, the lower re-distribution layer and the stack may be formed in advance and then the semiconductor chip may be stacked thereon. This may be beneficial to use the lower re-distribution layer, the stack, and the semiconductor chip, which have been qualified as good products, for the semiconductor package, and consequently to improve a total production yield of the semiconductor package. Furthermore, the lower re-distribution layer and the stack may be formed by an independent process, which may be performed concurrently with the formation of the semiconductor chip. Accordingly, it may be beneficial to reduce a total process time for fabricating the semiconductor package.

In a semiconductor package according to an example embodiment of the inventive concept, since the upper re-distribution layer is provided, it may be beneficial to reduce technical restrictions in disposing the connection terminals of the lower re-distribution layer and/or the stack and in designing an overall structure of the semiconductor package. For example, the upper redistribution layer rearrange in/out contact pads of a semiconductor device disposed on the upper redistribution layer to fit with contact pads of the lower redistribution layer and/or the stack structure.

In a semiconductor package according to an example embodiment of the inventive concept, since deposition, coating, exposure, and develop processes are used to form the stack, it may be beneficial to reduce a size of a via hole. For example, a photolithography process may be beneficial to form a reduced size of a via hole. Thus, an overall size of the semiconductor package may be decreased. Furthermore, it may be beneficial to reduce technical restrictions associated with a height of the stack and with a size of a semiconductor chip allowed for the semiconductor package. For example, various embodiments of the present disclosure may be beneficial to stack multiple semiconductor chips in a semiconductor package.

In a semiconductor package according to an example embodiment of the inventive concept, the vias may be arranged to form various paths in the stack. Thus, it may be beneficial to reduce technical restrictions in disposing the connection terminals of the lower re-distribution layer, the upper re-distribution layer, and/or the upper package and in designing an overall structure of the semiconductor package.

Figure 11:
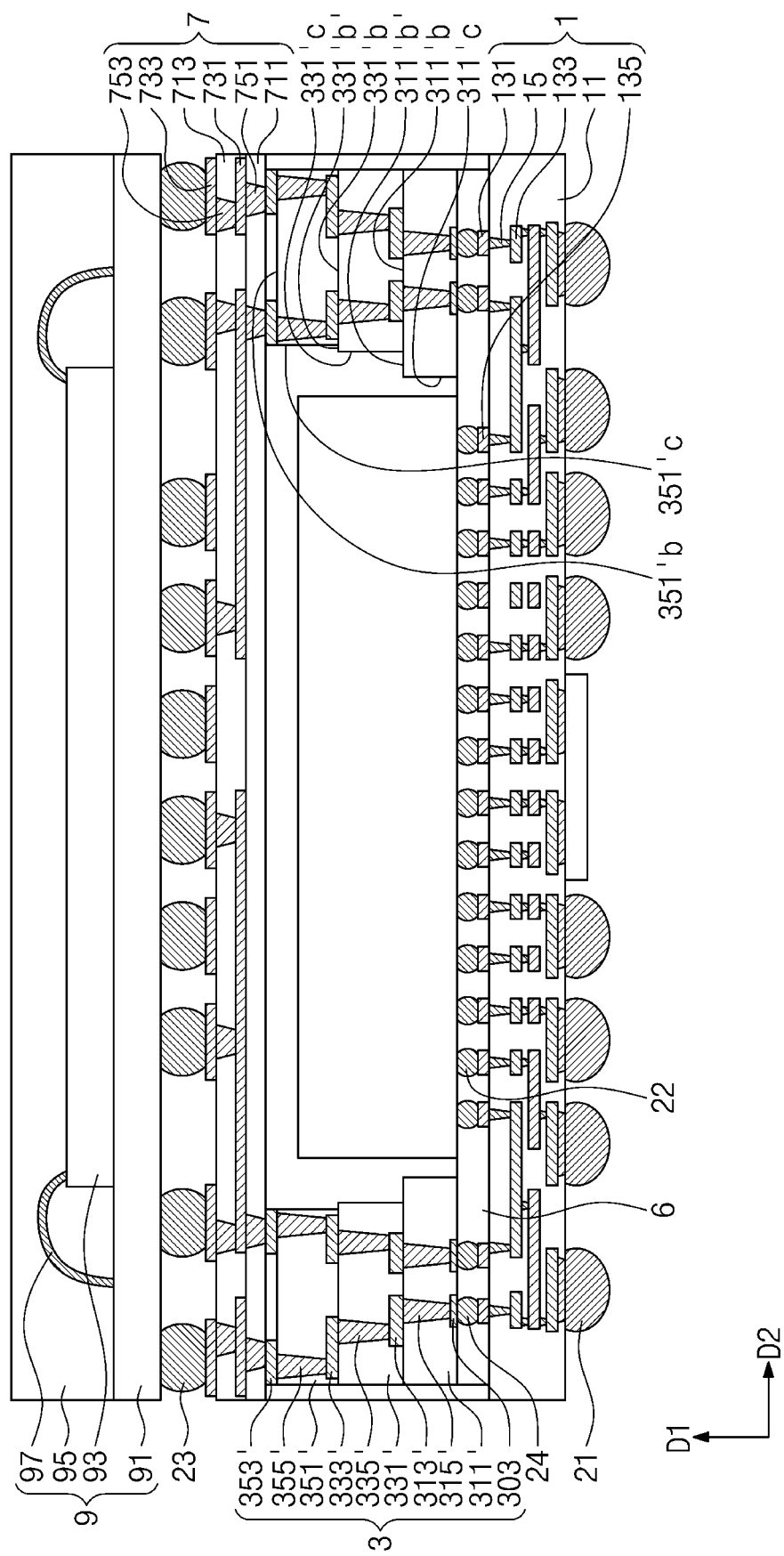
FIG. 11 is a sectional view illustrating a semiconductor package according to an embodiment of the inventive concept.

FIG. 11 is a sectional view illustrating a semiconductor package according to an embodiment of the inventive concept.

In the following description, for concise description, a similar element to or the same element as that of the previously embodiments will be identified by the same reference number as that of the previously embodiment, without repeating an overlapping description thereof.

Referring to FIG. 11, the stack 3 may include a first insulating layer 311', a second insulating layer 331', a third insulating layer 351', a first via 315', a second via 335', a third via 355', a first interconnection line 313', a second interconnection line 333', an upper terminal 353', and a connection terminal 303.

The first insulating layer 311' may be placed on the top surface of the lower re-distribution layer 1. For example, the first insulating layer 311' may be disposed on the top surface of the lower redistribution layer 1 with an under fill layer and the connection ball 24 therebetween. The first via 315' may be provided to penetrate the first insulating layer 311'. The first interconnection line 313' may be provided on a first top surface 311'$b$ of the first insulating layer 311'. The first interconnection line 313' may be connected to (e.g., contact) the first via 315'.

The second insulating layer 331' may be placed on the first top surface 311'$b$ of the first insulating layer 311'. The second via 335' may be provided to penetrate the second insulating layer 331'. The second via 335' may be connected to (e.g., contact) the first interconnection line 313'. The second via 335' may be electrically connected to the first via 315' through the first interconnection line 313'. The second interconnection line 333' may be placed on a second top surface 331'$b$ of the second insulating layer 331'. The second interconnection line 333' may be connected to (e.g., contact) the second via 335'.

In an embodiment, the first insulating layer 311' and the second insulating layer 331' may form a staircase structure in a direction toward the semiconductor chip 5. For example, the first and second insulating layers 311' and 331' of the stack 3 may have a step structure in a side facing the semiconductor chip 5. For example, a first inner side surface 311'$c$ of the first insulating layer 311' may be positioned so as not to be aligned to a second inner side surface 331'$c$ of the second insulating layer 331', when viewed in a plan view. For example, side surfaces of the first and second insulating layers 311' and 331' may be positioned to be offset in a plan view. The first inner side surface 311'$c$ may be closer to the semiconductor chip 5 than the second inner side surface 331'$c$. An area of the second top surface 331'$b$ of the second insulating layer 331' may be smaller than an area of the first top surface 311'$b$ of the first insulating layer 311'. While the second insulating layer 331' is placed on the first insulating layer 311', a portion 311'$b'$ of the first top surface 311'$b$ of the first insulating layer 311' may be exposed by the second insulating layer 331'.

The third insulating layer 351' may be placed on the second top surface 331'$b$ of the second insulating layer 331'. The third via 355' may be provided to penetrate the third insulating layer 351'. The third via 355' may be connected to (e.g., contact) the second interconnection line 333'. The third via 355' may be electrically connected to the second via 335' through the second interconnection line 333'. The upper terminal 353' may be provided on a third top surface of the third insulating layer 351'. The upper terminal 353' may be connected to (e.g., contact) the third via 355'.

In an embodiment, the second insulating layer 331' and the third insulating layer 351' may form a staircase structure in a direction toward the semiconductor chip 5. For example, the second and third insulating layers 331' and 351' of the stack 3 may have a step structure in a side facing the semiconductor chip 5. For example, the second inner side surface 331'$c$ of the second insulating layer 331' and a third inner side surface 351'$c$ of the third insulating layer 351' may be positioned so as not to be aligned to each other, when viewed in a plan view. For example, side surfaces of the second and third insulating layers 331' and 351' may be positioned to be offset in a plan view. The second inner side surface 331'c may be closer to the semiconductor chip 5 than the third inner side surface 351'c. An area of the third top surface 351'b of the third insulating layer 351' may be smaller than an area of the second top surface 331'b of the second insulating layer 331'. While the third insulating layer 351' is placed on the second insulating layer 331', a portion 331'b' of the second top surface 331'b of the second insulating layer 331' may be exposed by the third insulating layer 351'.

Figure 12:
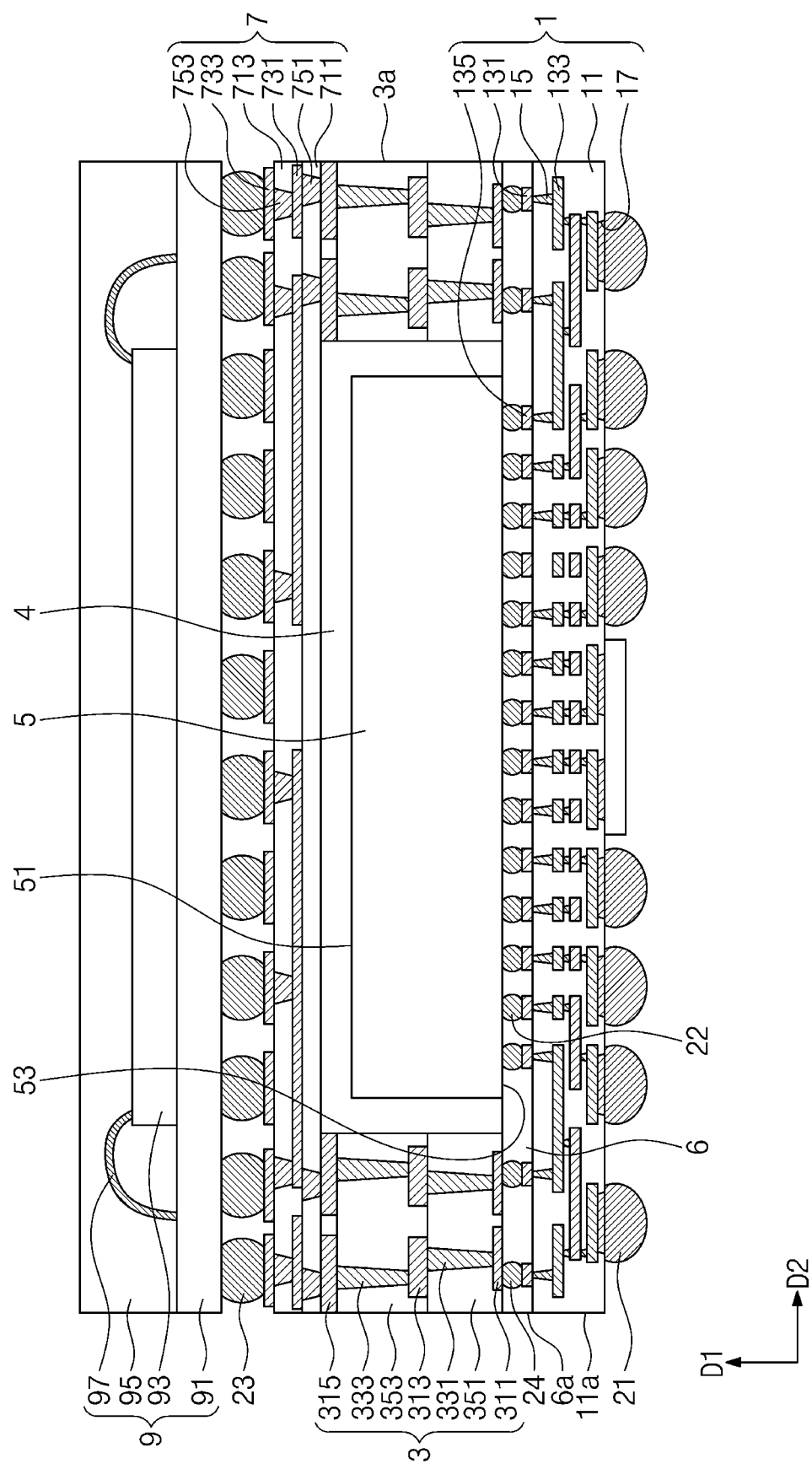
FIG. 12 is a sectional view illustrating a semiconductor package according to an embodiment of the inventive concept.

FIG. 12 is a sectional view illustrating a semiconductor package according to an embodiment of the inventive concept.

In the following description, for concise description, a similar element to or the same element as that of the previously embodiments will be identified by the same reference number as that of the previously embodiments, without repeating an overlapping description thereof.

Referring to FIG. 12, an outer side surface 3a of the stack 3 may not be covered with the mold layer 4. For example, the outer side surface 3a of the stack 3 may be exposed to the outside.

Figure 13:
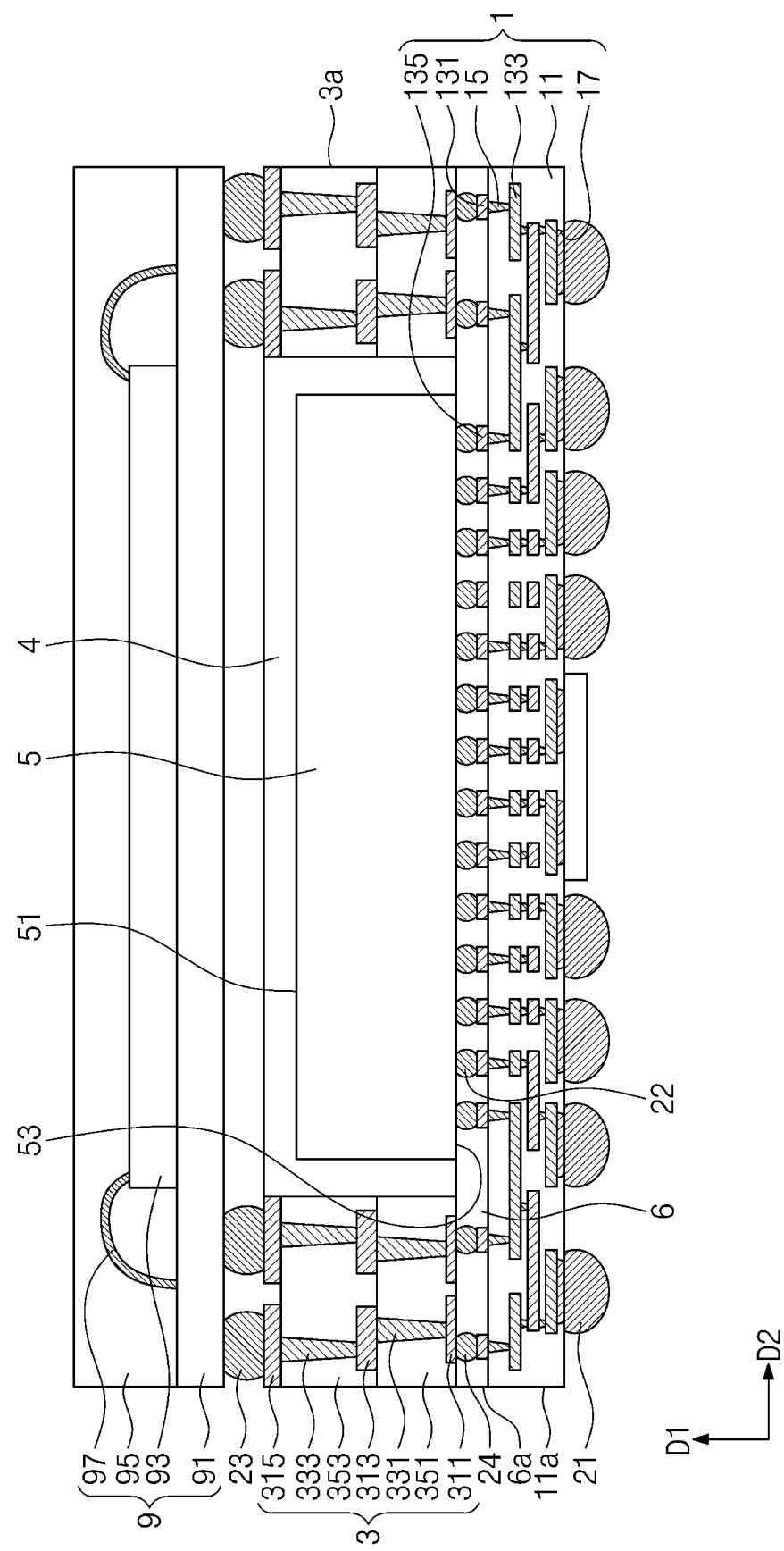
FIG. 13 is a sectional view illustrating a semiconductor package according to an embodiment of the inventive concept.

FIG. 13 is a sectional view illustrating a semiconductor package according to an embodiment of the inventive concept.

In the following description, for concise description, a similar element to or the same element as that of the previously embodiments will be identified by the same reference number as that of the previously embodiments, without repeating an overlapping description thereof.

Referring to FIG. 13, the stack 3 and the upper package 9 may be connected to each other, without the upper re-distribution layer therebetween. The second terminal 315 may be in contact with the upper ball 23. The second terminal 315 may be electrically connected to the upper package 9 through the upper ball 23.

Figure 14:
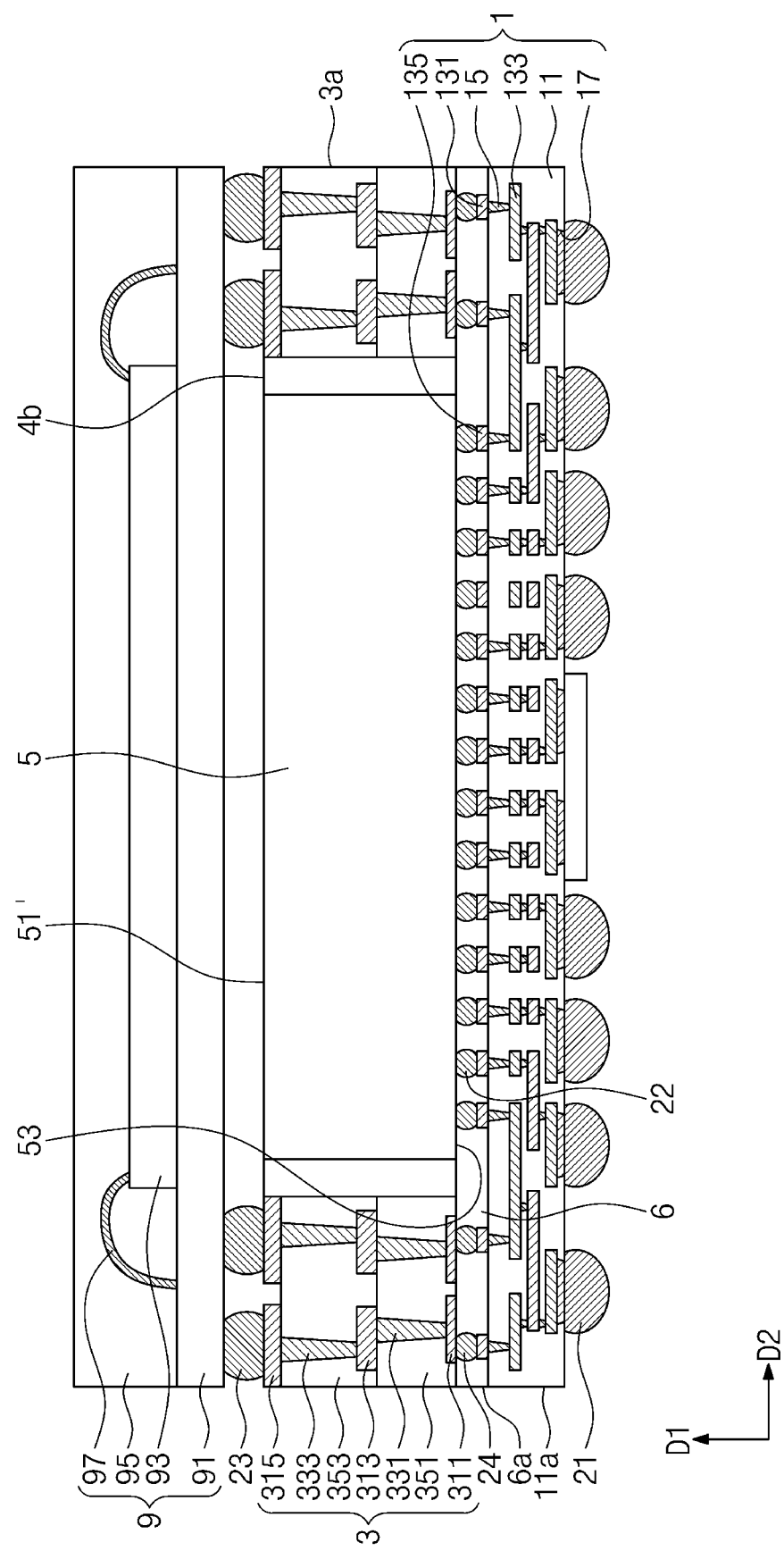
FIG. 14 is a sectional view illustrating a semiconductor package according to an embodiment of the inventive concept.

FIG. 14 is a sectional view illustrating a semiconductor package according to an embodiment of the inventive concept.

In the following description, for concise description, a similar element to or the same element as that of the previously embodiments will be identified by the same reference number as that of the previously embodiments, without repeating an overlapping description thereof.

Referring to FIG. 14, a top surface 4b of the mold layer 4 may be substantially coplanar with a top surface 51' of the semiconductor chip 5. Thus, even after the molding process forming the mold layer 4, the top surface 51' of the semiconductor chip 5 may be exposed.

In a method of fabricating a semiconductor package according to an embodiment of the inventive concept, a chip-last process may be applied to fabricate a package structure including a re-distribution layer, and it may be beneficial to form the re-distribution layer and a semiconductor chip through separate respective processes.

In a method of fabricating a semiconductor package according to an embodiment of the inventive concept, it may be beneficial to reduce a fabrication time and to improve a production yield.

In a method of fabricating a semiconductor package according to an embodiment of the inventive concept, it may be beneficial to reduce a size of a via, technical restrictions in constructing a path of the via, and a total volume of a semiconductor package.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor package, comprising:
   forming a lower re-distribution layer on a first substrate;
   forming a stack on a top surface of a second substrate different from the first substrate;
   removing the stack from the top surface of the second substrate;
   bonding the stack to a portion of the lower re-distribution layer;
   after bonding the stack, stacking a semiconductor chip on a top surface of the lower re-distribution layer; and
   forming an upper re-distribution layer on the semiconductor chip and the stack.

2. The method of claim 1, wherein the stack comprises:
   a first insulating layer on the top surface of the lower re-distribution layer;
   a second insulating layer on a top surface of the first insulating layer;
   a first via penetrating the first insulating layer;
   a second via penetrating the second insulating layer; and
   a first interconnection line electrically connecting the first via to the second via,
   wherein each of the first via and the second via have an upwardly increasing width.

3. The method of claim 2, wherein a vertically extending central axis of the second via is spaced apart from a vertically extending central axis of the first via.

4. The method of claim 1, further comprising forming a mold layer to cover at least one of surfaces of the semiconductor chip.

5. The method of claim 1, further comprising stacking an upper package on the upper re-distribution layer.

6. The method of claim 1, wherein the forming of the upper re-distribution layer comprises performing a deposition or coating process.

7. A method of fabricating a re-distribution structure, comprising:
   forming a lower re-distribution layer on a first substrate;
   forming a stack on a top surface of a second substrate different from the first substrate;
   removing the stack from the top surface of the second substrate; and
   bonding the stack to a top surface of the lower re-distribution layer,
   wherein the stack comprises:
   a first insulating layer disposed on the top surface of the lower re-distribution layer;
   a second insulating layer disposed on a top surface of the first insulating layer;
   a first via penetrating the first insulating layer; and
   a second via penetrating the second insulating layer.

8. The method of claim 7, wherein a vertically extending central axis of the second via is spaced apart from a vertically extending central axis of the first via.

9. The method of claim 7, further comprising a first interconnection line electrically connecting the first via to the second via.

10. The method of claim 7, wherein the bonding of the stack comprises performing a reflow process.

11. The method of claim 7, wherein the first insulating layer and the second insulating layer comprises a photo imageable dielectric (PID) material.

12. A method of manufacturing a semiconductor package, the method comprising:
   forming a lower re-distribution layer on a first substrate;
   forming a stack of insulators and conductor patterns on a second substrate different from the first substrate;
   removing the stack from the second substrate;
   bonding the stack to a portion of the lower re-distribution layer;
   after bonding the stack, disposing a semiconductor chip on a top surface of the lower re-distribution layer; and
   forming an upper re-distribution layer on the semiconductor chip and the stack.

13. The method of claim 12, further comprising vertically inverting the stack on a top surface of the second substrate before bonding the stack to the portion of the lower re-distribution layer.

14. The method of claim 12, wherein the stack comprises:
   a first insulating layer;
   a second insulating layer on a top surface of the first insulating layer;
   a first via penetrating the first insulating layer;
   a second via penetrating the second insulating layer; and
   a first interconnection line electrically connecting the first via to the second via,
   wherein each of the first via and the second via have an upwardly increasing width.

15. The method of claim 14, wherein a vertically extending central axis of the second via is spaced apart from a vertically extending central axis of the first via.

16. The method of claim 14, wherein the first insulating layer and the second insulating layer comprises a photo imageable dielectric (PID) material.

17. The method of claim 12, further comprising forming a mold layer to cover at least one of surfaces of the semiconductor chip.

18. The method of claim 12, further comprising stacking an upper package on the upper re-distribution layer.

19. The method of claim 12, wherein the bonding of the stack comprises performing a reflow process.

* * * * *